(12) United States Patent
Sukumaran et al.

(10) Patent No.: US 11,381,318 B1
(45) Date of Patent: Jul. 5, 2022

(54) CONTROL OF TRANS-IMPEDANCE AMPLIFIER (TIA) DURING SETTLING AFTER RECOVERING FROM LOSS OF SIGNAL IN RECEIVER

(71) Applicant: II-VI Delaware, Inc, Wilmington, DE (US)

(72) Inventors: Dinup Sukumaran, Wilmington, DE (US); Ken C. Kiong, Wilmington, DE (US)

(73) Assignee: II-VI DELAWARE, INC, Wilmington, DE (US)

( * ) Notice: Subject to any disclaimer, the term of this patent is extended or adjusted under 35 U.S.C. 154(b) by 0 days.

(21) Appl. No.: 17/390,131

(22) Filed: Jul. 30, 2021

(51) Int. Cl.
*H04B 10/06* (2006.01)
*H04B 10/69* (2013.01)
*H04B 10/2507* (2013.01)

(52) U.S. Cl.
CPC ..... *H04B 10/6933* (2013.01); *H04B 10/2507* (2013.01); *H04B 10/6911* (2013.01)

(58) Field of Classification Search
CPC ............ H04B 10/6933; H04B 10/6911; H04B 10/6931; H04B 10/40; H04B 10/2507; H04B 10/0795; H04B 10/07955; H04B 10/69; H04B 10/691
USPC ....... 398/202, 208, 209, 210, 212, 213, 214, 398/204, 207, 135, 136, 137, 138, 139, 398/33, 38, 158, 159; 330/59, 308; 250/214 A, 214 AG, 214 LA, 214 R
See application file for complete search history.

(56) References Cited

U.S. PATENT DOCUMENTS

| | | | | |
|---|---|---|---|---|
| 7,305,190 B2 * | 12/2007 | Mayampurath | ......... | H03F 3/087 398/209 |
| 7,368,999 B2 | 5/2008 | Natzke | | |
| 8,660,439 B2 * | 2/2014 | Kang | ................. | H04B 10/6931 398/210 |
| 2007/0098416 A1 * | 5/2007 | Nogami | ............... | H03G 3/3084 398/208 |

* cited by examiner

*Primary Examiner* — Hanh Phan
(74) *Attorney, Agent, or Firm* — Blank Rome LLP

(57) ABSTRACT

An optical receiver includes a photodiode, a transimpedance amplifier (TIA), a slope detection circuit, and a logic circuit. The TIA includes an output stage and a feedback amplifier and is coupled to the photodiode. The slope detection circuit is coupled to the feedback amplifier and configured to monitor a feedback signal from the feedback amplifier. The slope detection circuit is configured to provide, in response to a slope in the feedback signal being detected, a first slope-status signal indicating the slope is detected. The logic circuit is coupled to the slope detection circuit and is coupled to the output stage of the TIA. The logic circuit is configured to squelch the output stage of the TIA in response to the first slope-status signal.

20 Claims, 5 Drawing Sheets

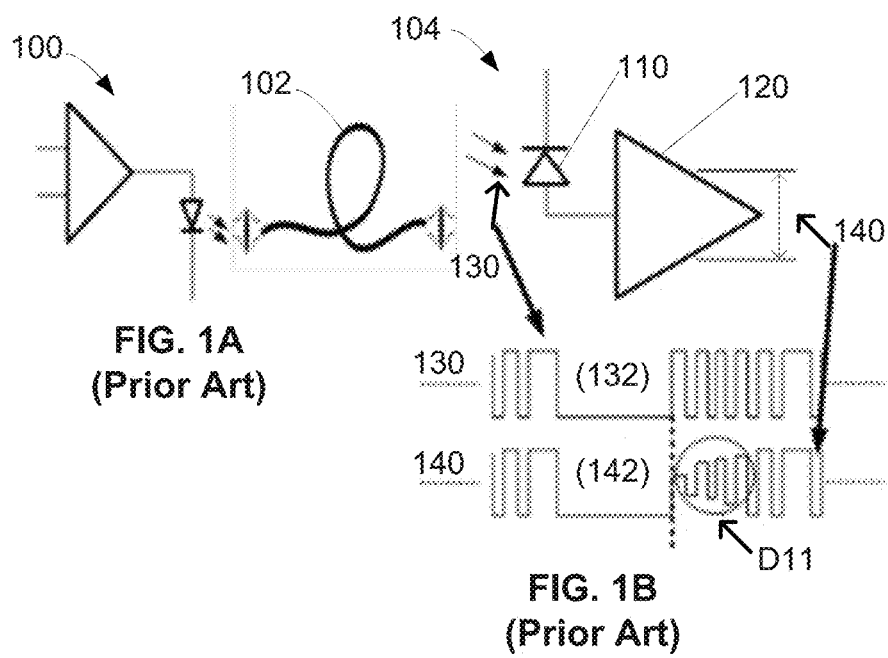
FIG. 1A
(Prior Art)
FIG. 1B
(Prior Art)
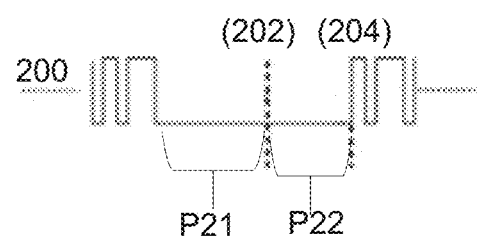
FIG. 2

Send a squelch signal to an output buffer of trans-impedance amplifier (TIA) to squelch an output voltage of the TIA, In response to a LOS status signal indicating loss of signal (LOS) — 801

Send a squelch signal to the output buffer of TIA to squelch the output voltage of the TIA and send a slope-rate control signal to a speed-up circuit to speed up a feedback amplifier of TIA, in response to a first slope-status signal indicating that a slope in a feedback control signal is detected, when the optical signal has resumed after being lost — 802

Send an unsquelch signal to the output buffer of TIA to unsquelch the output voltage of the TIA and send a shut-down control signal to shut down the speed-up circuit, in response to receiving a second slope-status signal indicating the slope is NOT detected in the feedback control signal, when the optical signal has resumed after being lost — 803

FIG. 7

CONTROL OF TRANS-IMPEDANCE AMPLIFIER (TIA) DURING SETTLING AFTER RECOVERING FROM LOSS OF SIGNAL IN RECEIVER

BACKGROUND OF THE DISCLOSURE

For the purposes of this discussion, a fiber-optic cable physical interface is considered. As shown in FIG. 1A, data is transmitted over an optical fiber 102 from a laser transmitter 100 driven by a laser driver. Optical signals (130) from the optical fiber 102 are received at a receiver 104 through a combination of a photodetector 110 followed by a Trans-Impedance Amplifier (TIA) 120, whose output is electrical differential data (140), as illustrated in FIG. 1B.

In a data communication receiver 104, such as a small form-factor pluggable (SFP) module, one requirement is to squelch the output of the receiver 104 when a loss of input optical signal event is detected. The loss of signal may result from unplugging of the receiver, reconfiguring of the system, or other reasons. For example, FIG. 1B shows a loss of input (132) for the optical signal (130) and shows the squelch (142) of the TIA output data (140). When the input optical signal (130) resumes, the receiver's TIA 120 needs time to readapt to the change in input optical power level, during which time the TIA 120 will not be operating correctly. The TIA 120 preferably does not send out invalid data while the adaptation is still on-going. Therefore, there is a desire to stop outputting the data (140) from the TIA 120 until valid data can be sent, and there is a desire to start sending valid data (140) as soon as possible from the TIA 120 once operating correctly.

Some of the existing solutions turn on the TIA's output data (140) immediately on optical signal resumption and send invalid data (D11) as shown in FIG. 1B until the TIA 120 resettles to a valid operating condition. Other solutions use a fixed delay to keep the TIA's output squelched (142) to avoid sending such invalid data (D11). Because the TIA's settling time depends on input optical signal levels, these fixed delays can be either smaller or larger than the actual settling time required for the TIA 120. If the delay is shorter than the actual TIA settling time, then that results in sending invalid data (D1). If the delay is longer than the TIA settling time, then the response time up to the resumption of the optical signal is unnecessarily increased. Not only do existing solutions not adequately time when to resume outputting data (140) for the TIA 120, existing technologies do not have a mechanism to speed up the time in which to output valid data (140) during an optical input signal resumption event to meet the shorter settling time desired.

The subject matter of the present disclosure is directed to overcoming, or at least reducing the effects of, one or more of the problems set forth above.

SUMMARY OF THE DISCLOSURE

In some examples, an optical device for optical signals includes a photodiode, a transimpedance amplifier (TIA), a feedback amplifier, and a detection circuitry. The photodiode is configured to receive the optical signals. The TIA has an input stage and an output stage. The input stage is coupled to the photodiode. The output stage is coupled to the input stage and is controllable to enable and disable output of a transimpedance amplifier output. The feedback amplifier is configured to provide a feedback signal from the output stage to the input stage of the transimpedance amplifier. The detection circuitry is configured to detect for a rate of change in the feedback signal of the feedback amplifier and being configured to determine a first state indicative of an absence of the optical signals at the photodiode. At least in response to the determined first state, the detection circuitry is configured to disable the output stage of the transimpedance amplifier.

In certain example, an optical receiver includes a photodiode, a transimpedance amplifier (TIA), a slope detection circuit, and a logic circuit. The TIA includes an output stage and a feedback amplifier and is coupled to the photodiode. The slope detection circuit is coupled to the feedback amplifier and configured to monitor a feedback signal from the feedback amplifier. The slope detection circuit is configured to provide, in response to a slope in the feedback signal being detected, a first slope-status signal indicating the slope is detected. The logic circuit is coupled to the slope detection circuit and is coupled to the output stage of the TIA. The logic circuit is configured to squelch the output stage of the TIA in response to the first slope-status signal.

In another example, A method of controlling an output of a transimpedance amplifier (TIA) includes sending, in response to a first indication signal asserting loss of signal (LOS), a squelch signal to an output buffer of the TIA to squelch an output voltage of the TIA; sending, in response to a second indication signal de-asserting LOS and a first slope-status signal indicating a slope is detected, a squelch signal to the output buffer of the TIA to squelch the output voltage of the TIA; and sending, in response to the second indication signal de-asserting LOS and a second slope-status signal indicating the slope is not detected, an unsquelch signal to the output buffer of the TIA to unsquelch the output voltage of the TIA.

The foregoing summary is not intended to summarize each potential embodiment or every aspect of the present disclosure.

BRIEF DESCRIPTION OF THE DRAWINGS

FIG. 1A illustrates a conventional optical communication system having a transmitter communicating optical signals to a receiver via an optical fiber.

FIG. 1B illustrates optical signals received at the receiver compared to invalid output signals output by the receiver due to recovering from a loss of signal (LOS) state.

FIG. 2 illustrates an example of desired output for a Trans-Impedance Amplifier operated according to the present disclosure.

FIG. 7 shows a flowchart of an example method of controlling an output of a TIA consistent with the present disclosure.

DETAILED DESCRIPTION OF THE DISCLOSURE

The teachings of the present disclosure are directed to a slope detection circuit to accurately detect when a Trans-Impedance Amplifier (TIA) of an optical receiver has settled after a signal resumption event (e.g., after loss of signal) has occurred at the input of the TIA. Accurate sensing of the TIA's settling is used to avoid sending invalid data by squelching the output of the TIA until a control loop of the TIA re-adapts and settles back into a correct operating condition. This slope detection circuit can be coupled to a speed-up circuit to facilitate speeding-up the TIA control loop, during the TIA input signal resumption event, in order to reduce the amount of time the TIA takes to settle back to normal operating condition. The speed-up circuit for the TIA control loop can reduce the TIA's adaptation time once the signal resumes.

FIG. 2 illustrates an example of desired output for a Trans-Impedance Amplifier operated according to the present disclosure. Data 200 for the TIA's output proceeds until there is a loss of signal detected at the receiver. When a loss of input optical signal event is detected and a LOS indication is asserted, the output of the TIA's data is squelched for time period P21. At point 202, the input optical signal resumes, the LOS indication is de-asserted, but the squelch of the TIA's output is not yet de-asserted because the receiver's (TIA) needs time to adapt or readapt. After point 202, there is a slope of the TIA's DC cancellation amplifier's output signal, which can be detected by the slope detect circuit described in more detail below. Accordingly, the output of the receiver is further squelched in the time period P22 until the TIA has adapted. Eventually, at a point 204 when adaption or settling of the TIA of the receiver is completed after time period P22, there is no slope of the TIA's DC cancellation amplifier's output signal, and the squelch of the TIA's output is de-asserted. Accordingly, the data 200 for the receiver's output can continue without including invalid data. By using the slope detection circuit disclosed herein, the settling instant of the TIA's direct-current (DC) cancellation loop can be accurately sensed to avoid sending invalid data until the loop settles down; and valid data can be available at the TIA output promptly. In one preferred configuration, the time period P22 from when the input signal resumes to when the squelch of the TIA's output is ended can be within 80 µs of a transient step input.

Figure 3:
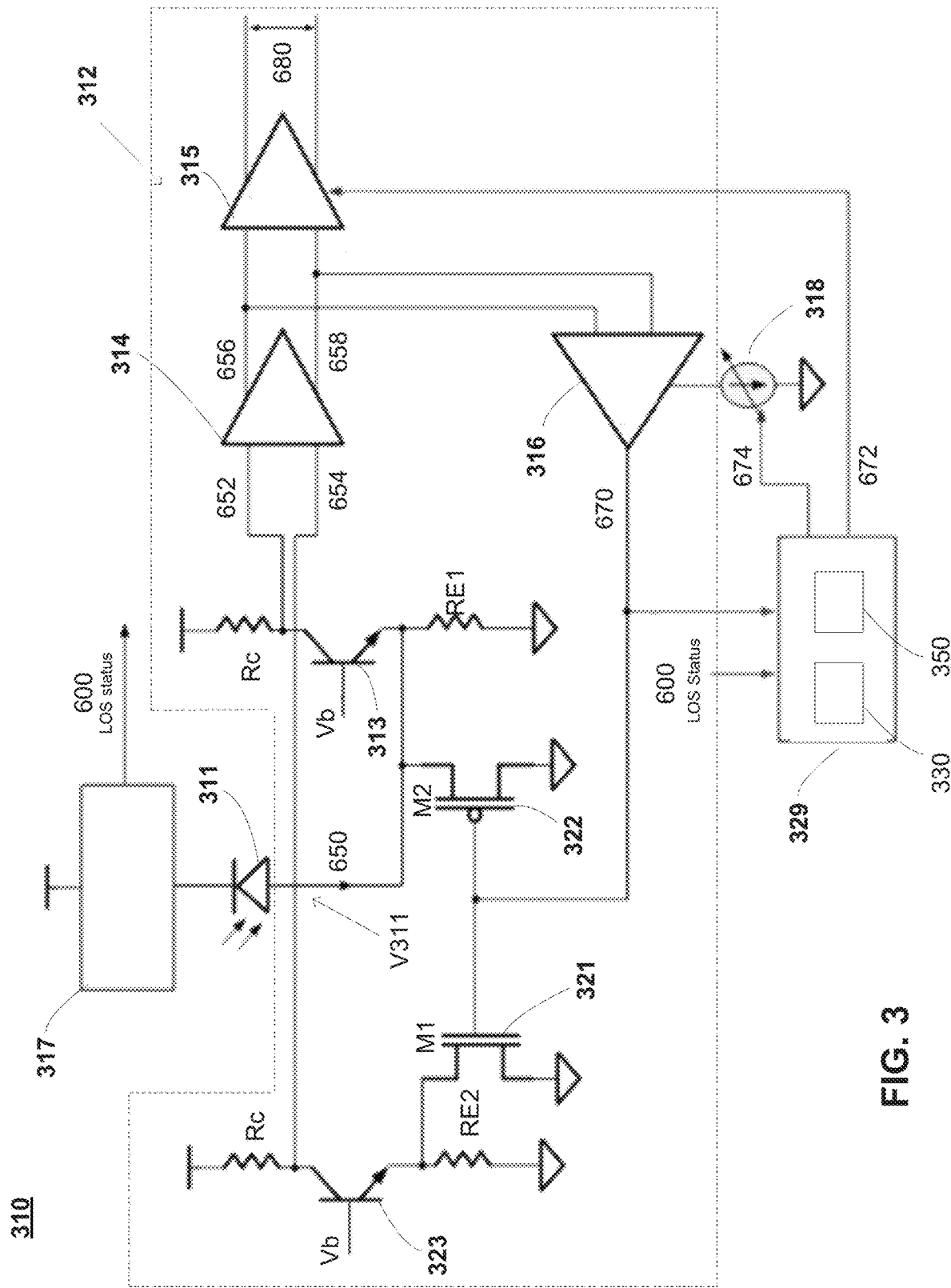
FIG. 3 illustrates a simplified block diagram of an optical receiver with a transimpedance amplifier (TIA) according to the present disclosure.

Having an understanding of how a slope detection circuit of the present disclosure is intended to control the output of a TIA for a receiver, discussion now turns to the circuitry and other features of a receiver, and a method of controlling an output of a TIA for a receiver (see, e.g., FIG. 7). In particular, FIG. 3 illustrates a simplified block diagram of an optical receiver 310 according to the present disclosure. The optical receiver 310 includes a photodiode 311, a received-signal-strength indicator (RSSI) 317, a transimpedance amplifier (TIA) 312, a DC cancellation feedback amplifier 316, a slope-handling circuit 329, and an output buffer 315. Additionally, the optical receiver 310 can include a recovery speed-up circuit 318.

In general and as will be described below, the optical receiver 310 receives an optical signal at the photodiode 311, and the transimpedance amplifier 312 converts the varying input current from the photodiode (amplifying it as well) to a voltage for output as a differential output voltage 680 from the output buffer 315. The DC cancellation feedback amplifier 316 is used with the received-signal-strength indicator (RSSI) 317, input transistor 313, dummy or mirror transistor 323, and the like to reduce a DC component of the current of the varying input current using negative feedback. The DC cancellation feedback amplifier 316 connects to the differential outputs 656, 658 from the gain stage amplifier 314.

Briefly, the photodiode 311 has a cathode connected to the received-signal-strength indicator (RSSI) 317 and has an anode connected to circuitry for the TIA 312. The photodiode 311 is configured to receive an input optical signal and convert the input optical signal to an electrical signal 650, whose current is proportional to the optical power. The input transistor 313 for a low noise input stage of the TIA 312 is configured to receive the electrical signal 650 from the photodiode 311 and is configured to provide an electrical signal 652 to a first terminal of a differential voltage amplifier 314 of a gain stage of the TIA 312. A second terminal of this gain stage amplifier 314 is connected to the dummy or mirror transistor 323. Both the dummy transistor 323 and the input transistor 313 connect to feedback from the DC cancellation feedback amplifier 316. Namely, the feedback signal 670 from the feedback amplifier connects to the gate input of an n-channel MOSFET transistor 321, which has one terminal connected to the emitter of the bipolar junction transistor for the dummy transistor 323 and has another terminal connected to ground. Similarly, the feedback signal 670 from the feedback amplifier connects to a p-channel MOSFET transistor 322, which has one terminal connected to the emitter of the bipolar junction transistor of the input transistor 313 (e.g., input stage transistor) and has another terminal connected to ground. In general, the transistors 313, 323 have low input offset voltages and are used to handle DC offset in the output of the transimpedance amplifier 312.

The gain stage amplifier 314 is coupled to an output buffer 315 of the TIA 312 with the gain amplifier 314 providing differential outputs 656, 656 to the output buffer 315. In turn, the output buffer 315 provides a differential output voltage 680 for the receiver 310. In response to a control signal 672 (e.g., a squelch signal or an unsquelch signal), however, received at the output buffer 315 from circuitry described below, the differential output voltage 680 of the output buffer 315 can be squelched and unsquelched.

To squelch the differential output voltage 680 of the buffer 315 in response to a loss of signal, the TIA 312 uses the LOS status 600. To unsquelch the differential output voltage 680 of the buffer 315 in response to a resumption of signal, the TIA 312 uses LOS status 600 and the slope-handling circuit 329.

To speed up the recovery, the TIA uses the speed-up circuit 318. After a loss of signal has occurred and then resumes, the output of the feedback amplifier 316 would be temporarily out of synch to the differential voltages being produced by the TIA 312. Given the speed-up signal 674, however, the speed-up circuit 318 can reduce the time it takes for output of the dummy transistor 323 to be the same as the input transistor 313. To do this, the speed-up circuit 318 is configured to increase the slew rate of the feedback amplifier when speed-up is indicated by the signal 674 from the slope-handling circuit 329.

On the cathode-side of the photodiode 311, the received signal strength indicator (RSSI) 317 is configured to indicate the received signal strength and to provide, via an output terminal of the RSSI 317, an LOS status signal 600 indicating a loss of signal (LOS) in response to the input optical signal being lost. That is, a loss of signal (LOS) is asserted, in response to the input optical signal being lost. Accordingly, the output stage 315 is switched-off in a manner discussed below.

On resumption of the input optical signal, the LOS is de-asserted. That is, a LOS status signal 600 indicating that optical signal is not lost (i.e., non-LOS or LOS de-asserted) is generated or provided. Accordingly, the TIA 312 adapts or re-adapts to such change using a DC cancellation loop that includes the DC cancellation feedback amplifier 316. The TIA 312 takes a certain settling time to adapt or readapt. During the settling time, the output buffer 315 of the TIA 312 has a DC offset, and accordingly output data from the TIA 312 is invalid.

To facilitate resumption and sending valid data from the output buffer 315, the circuitry of the optical receiver 310 (FIG. 3) includes a slope-handling circuit 329. As schematically shown here and discussed in more detail below, the slope-handing circuit 329 includes a slope detection circuit 330 and a digital logic circuit 350. The slope-handling circuit 329 receives the LOS status signal 600 from the RSSI 317 and receives the feedback control signal 670 from the feedback amplifier 316. The slope detection circuit 330 may be configured to receive and monitor the DC-cancellation feedback control (DCCFC) signal 670 from the DC cancellation feedback amplifier 316.

Figure 6:
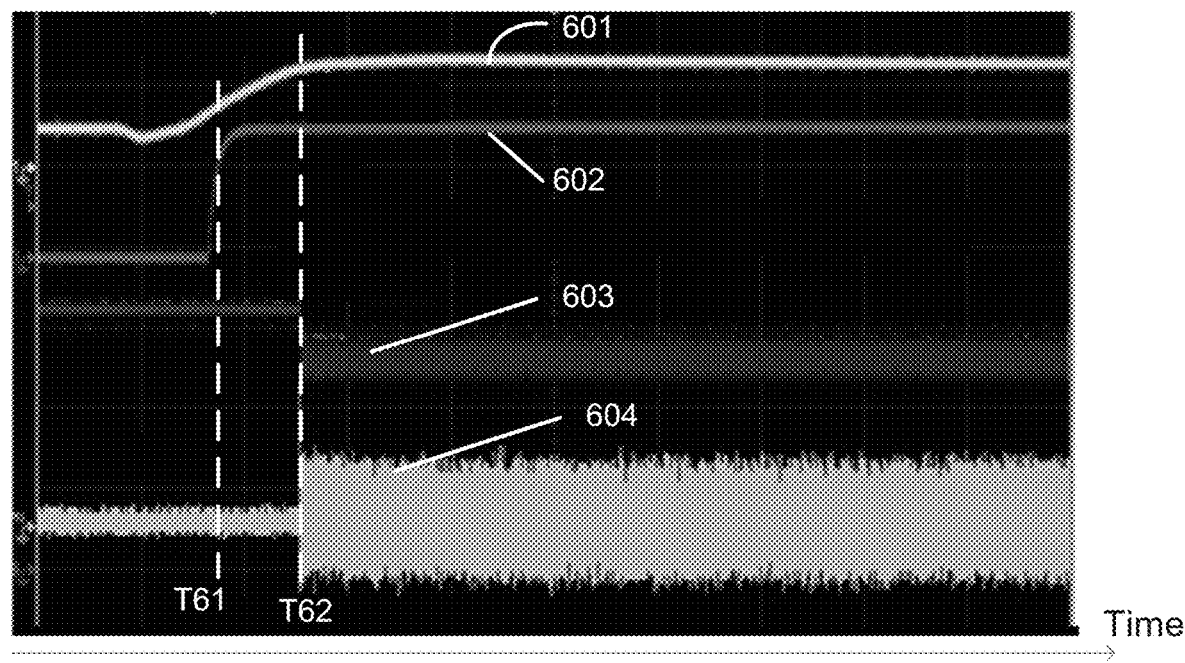
FIG. 6 shows turning "ON" of the TIA's output using a dynamic delay determined by an example slope detection circuit.

In response to the LOS status signal 600 indicating loss of signal (LOS), the slope-handling circuit 329 provides or sends a squelch signal 672 to the output buffer 315 to squelch the differential output voltage 680 (also see 801 of FIG. 6). For example, the squelch signal 672 is used to disable the output buffer 315. When the LOS status signal 600 indicates that optical signal is not lost, the control signal 672 from the slope-handling circuit 329 to the output buffer 315 is determined according to whether a slope is detected in the feedback control signal 670 of the DC cancellation feedback amplifier 316, as discussed in more detail below.

In some configurations of the receiver 310 such as shown here, a speed-up circuit 318 may be configured to increase a recovery or adaptation rate of the DC cancellation feedback amplifier 316, in response to the slope detected in the DCCFC signal 670 from the DC cancellation feedback amplifier 316 by the slope detection circuit 330. For example, in response to the slope detected in the feedback control signal 670 by the slope detection circuit 330, the digital logic circuit 350 outputs a control signal 674 to the speed-up circuit 318; and in response to the control signal 674, the speed-up circuit 318 increases a recovery or adaptation rate of the DC cancellation feedback amplifier 316. As noted, the speed-up circuit 318 is configured to increase the slew rate of the feedback amplifier 316 when speed-up is indicated by the signal 674 from the slope-handling circuit 329.

The slope detection circuit 330 is configured to monitor the settling of the TIA 312 after the input optical signal resumes, as indicated by the LOS status signal 600. In some examples, the slope-handling circuit 329 switches the TIA's output buffer 315 "ON" after the TIA 312 settles down, by sending an unsquelch signal 672 (e.g., a squelch de-assert signal) to the output buffer 315. That is, in response to the TIA 312 settling down after a loss of signal, the slope-handling circuit 329 turns the TIA's output buffer 315 "ON" by sending the unsquelched signal 672 (e.g., a squelch de-assert signal) from the slope-handling circuit 329 to the output buffer 315. In certain examples, the slope-handling circuit 329 turns "OFF" (e.g., squelches) the TIA's output buffer 315 by sending a squelch signal 672 to the output buffer 315. As only schematically shown here, the signal 672 is illustrated as enabling and disabling the output buffer 315 by operating a switch for a current source to the output buffer 315.

The speed-up circuit 318 can decrease the settling time of the TIA 312 (i.e., the amount of time for the TIA 312 to reach normal operation). The speed-up circuit 318 may be controlled according to an output of the slope detection circuit 330. In particular, the slope detection circuit 330 monitors the slope of the control signal 670 of the DC cancellation feedback amplifier 316 of TIA 312. Output from the slope detection circuit 330 is asserted, e.g., is at a high voltage level, in response to the DC cancellation loop being in settling mode with a slope in the feedback control signal 670 of the DC cancellation amplifier 316. Output from the slope detection circuit 330 is de-asserted, e.g., is at a low voltage level, in response to the loop having settled down, e.g., the settling of the DC cancellation loop being completed. Accordingly, the output of the slope detection circuit 330 may be used to keep the output of the TIA 312 squelched with the squelch signal 672 until the completion of the setting of the TIA's DC cancellation loop, thereby preventing invalid data at the differential output voltage 680 of the output buffer 315. Such accurate determination of the settling instant of the TIA's DC cancellation loop, by using the slope detection circuit 330, can prevent sending invalid data out of the optical receiver 310. Further details of this slope detection circuit 330 is discussed below with reference to FIG. 4.

The output of the slope detection circuit 330 can also be used to enable the speed-up circuit 318 for the DC cancellation loop so that the loop works faster during step optical inputs (e.g., step-shaped optical signal inputs). The fast recovery mode for the TIA's DC cancellation loop, enabled by the slope detection circuit 330, can help the loop settle faster, so operation can meet a desired specification of a short (e.g., 80-µs) settling time even for high step optical inputs.

Once the DC cancellation loop settles down, the slope detection circuit 330 (or the slope-handling circuit 329) de-asserts, e.g., outputs a de-assert signal 674 at a low voltage level via the digital logic circuit 350, and the speed up circuit 318 is shut down, so that TIA's DC cancellation loop goes back to a normal mode of operation. Leaving the speed-up circuit 318 turned "ON" may increase the baseline wander of the output of the TIA 312, and increases the bandwidth of the DC cancellation feedback amplifier 316 (and accordingly decreases the bandwidth of the TIA) which can be undesirable. As only schematically shown here, the signal 674 is illustrated as adjusting a current source to the amplifier 316.

Having an understanding of the circuitry of the receiver 310 with its slope-handling circuit 329 (slope detection circuit 330 and digital logic circuit 350) and its speed-up circuit 318 used with the TIA 312, discussion turns to further details of the slope detection circuit 330.

Figure 4:
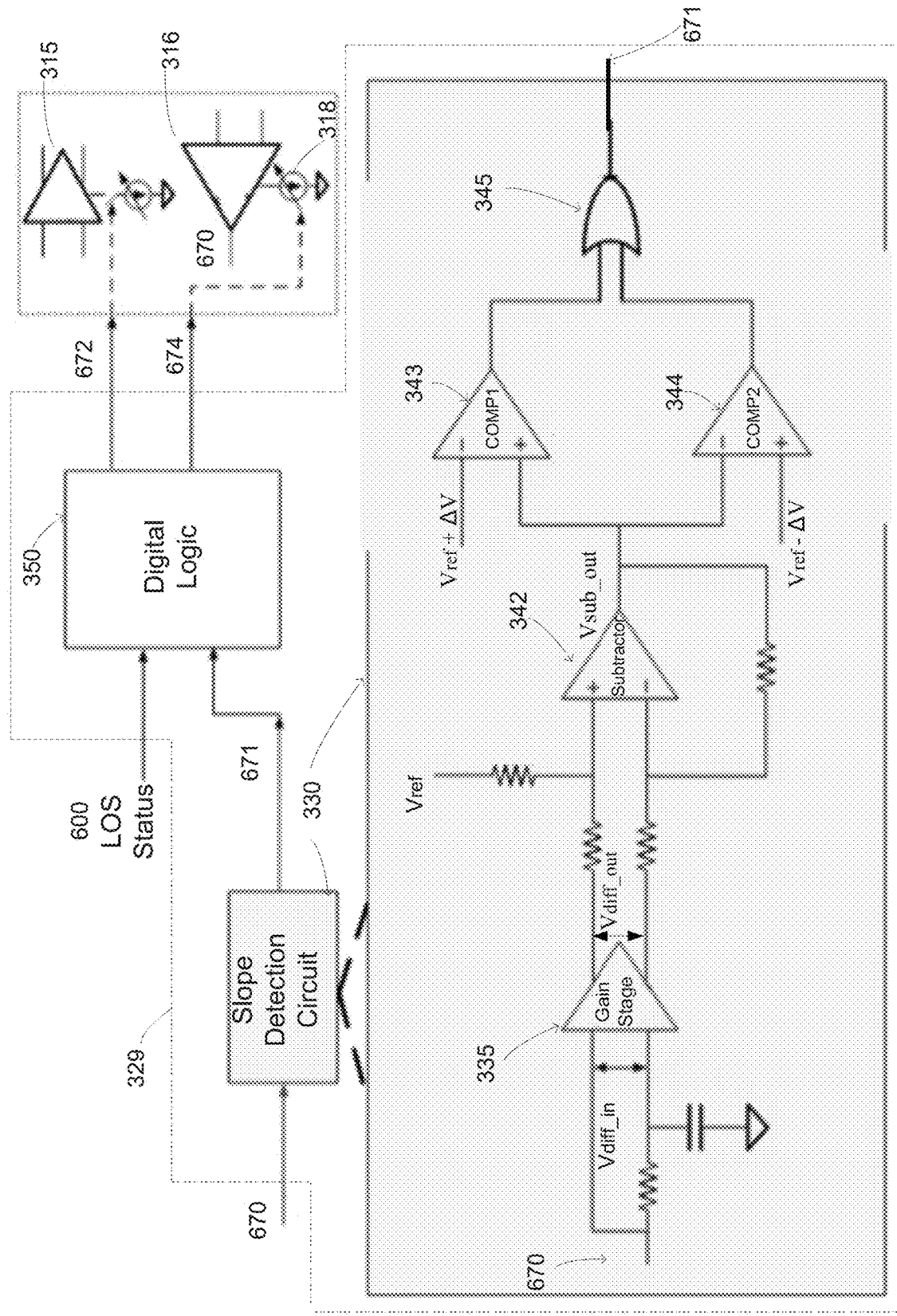
FIG. 4 shows an example slope detection circuit and an example digital logic circuit.

FIG. 4 shows an example slope detection circuit 330 and an example digital logic circuit 350 for the slope handling circuit 329 discussed previously. In this configuration, the slope detection circuit 330 and the digital logic circuit 350 are configured to output squelch/unsquelch signals 672 (i.e., assert squelch or de-assert squelch) and to control a fast recovery signal 674 of the DC cancellation loop.

The slope detection circuit 330 has an input terminal that receives the DC-cancellation feedback control (DCCFC) signal 670 and has an output terminal that outputs a slope-status signal 671. The slope detection circuit 330 is configured to receive and monitor the feedback control signal 670 from the DC cancellation feedback amplifier (316; FIG. 3). Processing that signal 670, the slope detection circuit 330 is configured to determine or detect whether there is a slope in the received DCCFC signal 670. A slope in the received feedback control signal 670 indicates the signal is changing over time and has not yet settled.

The digital logic circuit 350 has a first input terminal to receive the LOS status signal 600 and has a second input terminal to receive the slope-status signal 671 from the slope detection circuit 330. The digital logic circuit 350, which can include any suitable digital logic, provides the squelch signal 672 and the fast recover signal 674. In response to receiving the LOS status signal 600 indicating loss of signal (LOS), the digital logic circuit 350 is configured to send a squelch signal 672 to the output buffer 315. In response to the output buffer 315 receiving the squelch signal 672, the outputs of the output buffer 315 are squelched, as noted previously.

In response to a slope being detected in the feedback control signal 670 by the slope detection circuit 330, the slope detection circuit 330 provides or outputs a first slope-status signal 671 (e.g., an assert signal with a predetermined voltage level) indicating that a slope in the feedback control signal 670 is detected. In response to a slope NOT being detected in the feedback control signal 670 by the slope detection circuit 330, the slope detection circuit 330 provides or outputs a second slope-status signal 671 (e.g., a de-assert signal with a different predetermined voltage level) indicating that a slope in the feedback control signal 670 is not detected.

Accordingly, the output of the slope detection circuit 330 is coupled to the digital logic circuit 350, which is configured to receive the slope-status signal 671, which can indicate that a slope in the DCCFC signal is or is not detected in the DCCFC signal 670.

In some examples, the first input terminal of the digital logic circuit 350 receives the LOS status signal 600 indicating that the optical signal is no longer lost (i.e., has resumed after being lost); and the digital logic circuit 350 is configured to, in response to receiving the first slope-status signal 671 indicating that a slope in the feedback control signal 670 is detected, still send a squelch signal 672 to the output buffer 315, which then keeps the differential output voltage 680 squelched.

In certain examples, the first input terminal of the logic circuit 300 receives the LOS status signal 600 indicating that optical signal is no longer lost (i.e., has resumed after being lost); and the digital logic circuit 350 is further configured to, in response to receiving the first slope-status signal 671 indicating that a slope in the feedback control signal 670 is detected, still send a squelch signal 672 to the output buffer 315, and to further send a slope-rate control signal 674 to the speed-up circuit 318 for the DC cancellation feedback amplifier 316 (see, e.g., 802 of FIG. 6). Accordingly, the differential output voltage 680 of the output buffer 315 is squelched; and a recovery or adaptation rate of the DC cancellation feedback amplifier 316 is increased by the speed-up circuit 318.

In another example, the first input terminal of the digital logic circuit 350 receives the LOS status signal 600 indicating that optical signal is no longer lost (i.e., has resumed after being lost); and the digital logic circuit 350 is further configured to, in response to receiving a second slope-status signal 671 indicating the slope is NOT detected, send an unsquelch (squelch de-assert) signal 672 to the output buffer 315, and send a shut-down control signal 674 to shut down the speed-up circuit 318 for the DC cancellation feedback amplifier 316 (see, e.g., 803 of FIG. 7). Accordingly, the differential output voltage 680 of the output buffer 315 is un-squelched; and the speed-up circuit 316 of the DC cancellation feedback amplifier 316 is shut down.

Looking at the slope detection circuit 330 in more detail, the slope detection circuit 330 is configured to generate or have a voltage difference or difference voltage ($V_{diff\_in}$) of the feedback control signal 670 by splitting the signal and delaying one of the split signals relative to the other. A gain stage 335 amplifies the voltage difference ($V_{diff\_in}$) to generate a respective output voltage difference or output difference voltage ($V_{diff\_out}$) of the gain stage 335. For example, the arrangement of a resistor and a capacitor causes a time delay in voltages at a second input terminal of the gain stage 335 as compared to a first input terminal of the gain stage 335. Accordingly, when there is a slope in the feedback control signal, a voltage difference (denoted as $V_{diff\_in}$) between the input terminals of the gain stage 335 can represent or correspond to difference of voltages at different time points due to the slope in the feedback control signal.

A first output terminal of the gain stage 335 is coupled by a resistor to a first input terminal of a subtractor 342, and a second output terminal of the gain stage 335 is coupled by a resistor to a second input terminal of the subtractor 342. A voltage reference ($V_{ref}$) is also coupled to the first input terminal of the subtractor 342. A voltage difference ($V_{diff\_out}$) between the output terminals of the gain stage 335 is equal to the voltage difference ($V_{diff\_in}$) between the input terminals times an amplification factor ("A").

The subtractor 342 is configured to generate an output voltage ($V_{sub\_out}$) that is equal to the reference voltage ($V_{ref}$) when there is no difference between the voltage difference ($V_{diff\_out}$).

When there is no slope in the feedback control signal, a difference in the voltage ($V_{diff\_out}$) between the terminals of the subtractor is zero and the output voltage ($V_{sub\_out}$) of the subtractor 342 is equal to the reference voltage ($V_{ref}$).

The slope detection circuit 330 further includes first and second comparators 343, 343 with outputs to an OR gate 345 from which the slope-status signal 671 is available.

The first comparator 343 receives, at a voltage terminal, a voltage that is equal to a sum of the reference voltage ($V_{ref}$) and a threshold voltage (denoted as "$\Delta V$"), where the threshold voltage can be a positive voltage value. The output terminal of the first comparator 343 is configured to (a) output a high voltage level, in response to an input terminal of the first comparator 343 having a higher voltage than the voltage terminal of the first comparator 343; and (b) output a low voltage level, in response to the voltage of the input terminal being lower than or equal to the voltage of the voltage terminal of the first comparator 343.

For its part, the second comparator 344 receives, at a voltage terminal, a voltage that is equal to the reference voltage ($V_{ref}$) minus the threshold voltage ($\Delta V$), i.e., $V_{ref}-\Delta V$. The output terminal of the second comparator is configured to (a) output a high voltage level, in response to an input terminal of the second comparator 344 having a lower voltage than the voltage terminal of the second comparator 344; and (b) output a low voltage level in response to the voltage of the input terminal being higher than or equal to the voltage of the voltage terminal of the second comparator 344.

Using the outputs from the comparators 343, 344, the OR gate 345 is configured to output a high voltage level in response to the first comparator 343 or the second comparator 344 having a high voltage level; whereas the OR gate 345 is configured to output a low voltage level, in response to both comparators 343, 344 providing a low voltage level. Although an OR gate can output a high voltage level in response to both its inputs receiving a high voltage level, the comparators 343 and 344 of FIG. 4 do not both output a high voltage level at the same time. That is, when comparator 343 outputs a high voltage level, comparator 344 can only output a low voltage level; and when comparator 344 outputs a high voltage level, comparator 343 can only output a low voltage level.

The first comparator 343 detects a positive slope to the changing of the feedback control signal 670, and the second comparator 343 detects a negative slope to the changing of the feedback control signal 670. In certain examples, in response to a positive slope in the feedback control signal 670 received at the input terminal of the slope detection circuit 330, the voltage difference ($V_{diff\_out}=V_{diff\_in}*A$) between the outputs of the gain stage amplifier 335 is greater than the threshold voltage $\Delta V$, and the output voltage ($V_{sub\_out}$) at the output of the subtractor 342 is equal to $V_{ref}+V_{diff\_in}*A$. Accordingly, the voltage at the input terminal of the first comparator 343 is equal to $V_{ref}+V_{diff\_in}*A$, and is greater than the voltage ($V_{ref}+\Delta V$) at the voltage terminal of the first comparator 343. The output of the first comparator 343 is at a high voltage level; and the output of the OR gate 345 is at a high voltage level, as the first slope-status signal 671 indicating that a slope is detected. Thus, the slope detection circuit 330 can detect a positive slope in the feedback control signal, and output the first slope-status signal 671 at the high voltage level to indicate the slope being detected.

In another example, in response to a negative slope in the feedback control signal 670 received at the slope detection circuit 330, the voltage difference ($V_{diff\_in}$) at the first and second input terminals of the gain stage 335 is negative, and the voltage difference ($V_{diff\_out}=V_{diff\_in}*A$) at the first and second output terminals of the gain stage 335 is negative and less than minus threshold voltage (i.e., $-\Delta V$), and the output voltage ($V_{sub\_out}$) of the subtractor 342 is equal to $V_{ref}+V_{diff\_in}*A$. Accordingly, the voltage at the input terminal of the second comparator 344 is equal to $V_{ref}+V_{diff\_in}*A$, and is less than the voltage ($V_{ref}-\Delta V$) at the voltage terminal of the second comparator 344. The output of the second comparator 344 is at a high voltage level, and the output of the OR gate 345 is at a high voltage level, as the first slope-status signal 671 indicating that a slope is detected. Thus, the slope detection circuit 330 can detect a negative slope in the changing of the feedback control signal 670, and output the first slope-status signal 671 at the high voltage level to indicate the slope being detected.

In other examples, in response to no slope in the feedback control signal 670 received at the input of the slope detection circuit 330, the voltage difference ($V_{diff\_out}=V_{diff\_in}*A$) is less than the threshold voltage $\Delta V$ and greater than minus threshold voltage (i.e., $-\Delta V$), the output voltage ($V_{sub\_out}$) at the output of the subtractor 342 is equal to $V_{ref}+V_{diff\_in}*A$. Accordingly, the voltage at the input terminal of the first comparator 343 is equal to $V_{ref}+V_{diff\_in}*A$, and is less than the voltage ($V_{ref}+\Delta V$) at the voltage terminal of the first comparator 343. The voltage at the input terminal of the second comparator 344 is equal to $V_{ref}+V_{diff\_in}*A$, and is greater the voltage ($V_{ref}-\Delta V$) at the voltage terminal of the second comparator 344. The output of the first comparator 343 is at a low voltage level; and the output of the second comparator 344 is at a low voltage level. Thus, the output of the OR gate 345 is at a low voltage level, as the second slope-status signal 671 indicating that a slope is not detected. Thus, the slope detection circuit 330 can determine there is no slope in the feedback control signal 670 and can output the second slope-status signal 671 at a low voltage level to indicate there is no slope in the feedback signal 670.

As discussed previously with reference to FIG. 3, the slope detection circuit 330, the digital circuit 350, and the speed-up circuit 318 may be coupled to the TIA 312. In other examples, the slope detection circuit 330, the digital logic circuit 350, and the speed-up circuit 318 may be integrated into the TIA 312 or considered as portions of the TIA 312. For example, an integrated circuit for the TIA 312 can include the components of the slope detection circuit 330, the digital logic circuit 350, the speed-up circuit 318.

Figure 5:
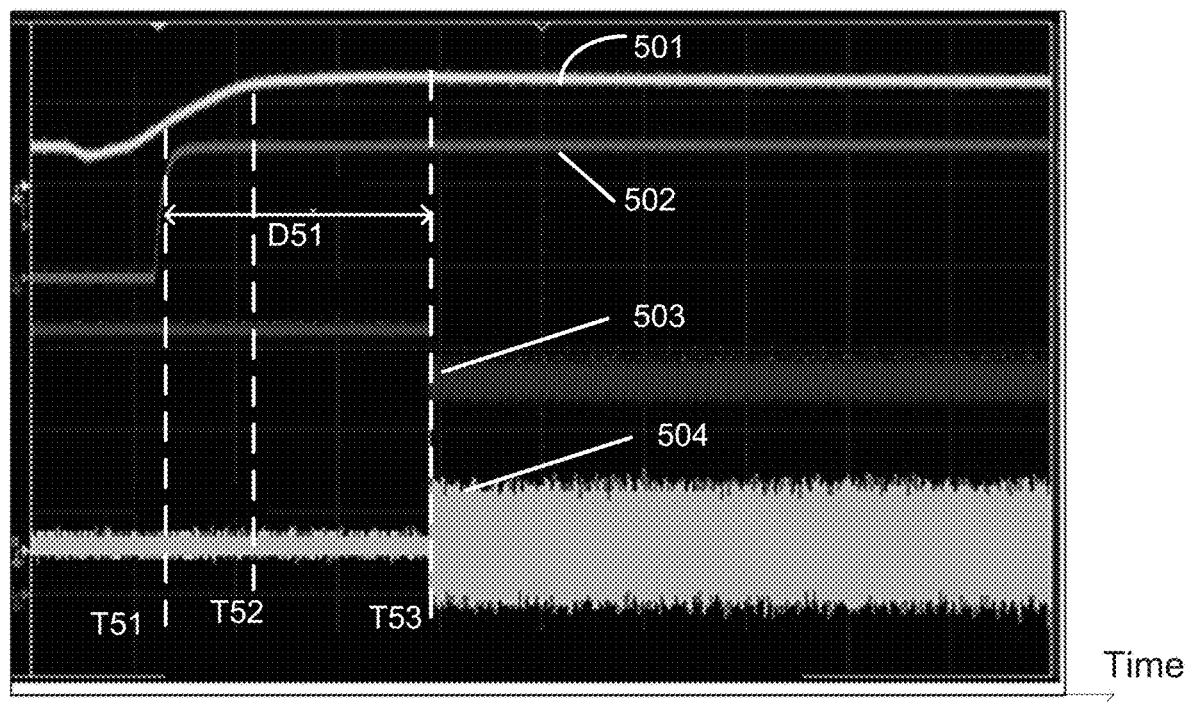
FIG. 5 shows turning "ON" of the TIA's output using a fixed delay from a time point of LOS de-assert.

To illustrate the teachings of the present disclosure further, example measurement results of the TIA's output un-squelching in response to an input optical step are shown in FIGS. 5 and 6. FIG. 5 graphs output of an un-squelching operation using a fixed delay according to the prior art, and FIG. 6 graphs output of an un-squelching operation using a slope detection circuit of the present disclosure.

Referring to FIG. 5, curve 501 shows TIA anode voltage at different time points. The TIA anode voltage 501 can be measured and is equivalent to the DC control signal. The settling of the TIA's DC cancellation loop can be interpreted from the settling of this TIA anode voltage curve 501. Curve 502 illustrates the LOS status at different time points. LOS status in curve 502 switches from a LOS assert status to LOS de-assert status at time point T51.

Curve 503 illustrates the squelch signal (672) from the slope-handling circuit (329) to the output buffer (315); and curve 504 illustrates output of the TIA (312) from the output buffer (315). Curves 503 and 504 of FIG. 5 show turning "ON" of output of the TIA at time point T53 using a fixed delay D51 from the time point T51 when LOS status curve 502 switches from a LOS assert status to a LOS de-assert status. The settling of the TIA's DC cancellation loop can be interpreted from the settling of TIA anode voltage in curve 501. Between time points T51 and T52, the TIA (e.g., TIA's DC cancellation loop) re-adapts, as indicated by the slope between T51 and T52 in curve 501. From time point T52, the TIA's DC cancellation loop has settled down. That is, from time point T52, TIA enters into a valid operating condition. In FIG. 5, however, the TIA's output shown in curve 504 remains squelched between time points T52 and T53, even after the TIA's DC cancellation loop has settled down from T52, as can be interpreted based on curve 501. As expected, this fixed delay D51 produces an undesirable behavior because the TIA resumes outputting data later than it could. Although not shown, the fixed delay D51 could equally result in the TIA resuming outputting data prematurely before the TIA's DC cancellation loop has settled down, and this would result in the TIA outputting invalid data.

In contrast, in FIG. 6, the TIA's output is turned "ON" using a dynamic time span (between T61 and T62) determined by a slope detection circuit consistent with the present disclosure. Referring to FIG. 6, curve 601 shows TIA anode voltage at different time points. The settling of the TIA's DC cancellation loop can be interpreted from the settling of TIA anode voltage 601. Curve 602 illustrates LOS status at different time points. The LOS status in curve 602 switches from a LOS assert status to LOS de-assert status at time point T61.

Curve 603 illustrates the squelch signal (672) from the slope-handling circuit (329) to the output buffer (315); and curve 604 illustrates output of the TIA (312) from the output buffer (315). Curves 603 and 604 of FIG. 6 show turning "ON" of output of the TIA at time point T62 using a dynamic delay determined by the slope detection circuit, such as circuit 330 in FIG. 3. The settling of the TIA's DC cancellation loop can be interpreted from the settling of TIA anode voltage in curve 601. Between time points T61 and T62, the TIA (e.g., TIA's DC cancellation loop) re-adapts, as indicated by a slope between T61 and T62 in curve 601. From time point T62, the TIA's DC cancellation loop has settled down. That is, from time point T62, TIA enters or switches into a valid or normal operating mode. In response to the TIA entering into the normal operating mode, the TIA's output shown in curves 603 and 603 switches "ON" promptly, because of the use of the slope detection circuit. Accordingly, the output of the TIA is turned "ON" (at time point T62) as soon as the TIA complete adapting to the input optical signal resumption, and enters into the normal operating mode (at time point T62).

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. An optical device for optical signals, the optical device comprising:
   a photodiode configured to receive the optical signals;
   a transimpedance amplifier (TIA) having an input stage and an output stage, the input stage coupled to the photodiode, the output stage coupled to the input stage and being controllable to enable and disable output of a transimpedance amplifier output;
   a feedback amplifier configured to provide a feedback signal from the output stage to the input stage of the transimpedance amplifier; and
   a detection circuitry being configured to detect for a rate of change in the feedback signal of the feedback amplifier and being configured to determine a first state indicative of an absence of the optical signals at the photodiode,
   wherein at least in response to the determined first state, the detection circuitry is configured to disable the output stage of the transimpedance amplifier.

2. The optical device of claim 1, wherein the detection circuitry is configured to determine a second state indicative of a presence of the optical signals at the photodiode; and wherein at least in response to the second state determined after the first state and in response to the detected rate of change, the detection circuitry is configured to disable the output stage of the transimpedance amplifier.

3. The optical device of claim 2, wherein the detection circuitry comprises a received-signal-strength indicator coupled to the photodiode and configured to indicate the first and second states of the optical signals at the photodiode.

4. The optical device of claim 2, wherein at least in response to the second state and in response to an absence of the rate of change in the feedback signal of the feedback amplifier, the detection circuitry is configured to enable the output stage of the TIA.

5. The optical device of claim 4, wherein the detection circuitry comprises a digital logic circuit processing logic combinations of the first state, the second state, the presence of the rate of change, and the absence of the rate of change and providing enable and disable signals to the output stage based on the processed logic combinations.

6. The optical device of claim 1, wherein the detection circuitry comprises a slope detection circuitry configured to detect for the rate of change in the feedback signal, the slope detection circuitry having:
   a first circuit configured to split the feedback signal and to delay one of the split signals from the other;
   a subtractor configured to subtract the split signals;
   a first comparator configured to compare the subtraction to a positive reference and to provide first comparative states therefrom;
   a second comparator configured to compare the subtraction to a negative reference and to provide second comparative states therefrom; and
   an OR logic gate receiving the first and second comparative states and configured to output a signal indicating the rate of change in the feedback signal.

7. The optical device of claim 1, wherein the detection circuitry is configured to determine a second state indicative of a presence of the optical signals at the photodiode, and the detection circuitry further comprises a recovery circuitry coupled to the feedback amplifier, the recovery circuitry being configured to increase a slew rate of the feedback amplifier at least in response to the second state and the detected rate of change.

8. The optical device of claim 1, wherein the optical device is an optical receiver or at least part of an optical transceiver.

9. An optical receiver, comprising:
   a photodiode;
   a transimpedance amplifier (TIA) including an output stage and a feedback amplifier and being coupled to the photodiode;
   a slope detection circuit coupled to the feedback amplifier and configured to monitor a feedback signal from the feedback amplifier, wherein the slope detection circuit is configured to provide, in response to a slope in the feedback signal being detected, a first slope-status signal indicating the slope is detected; and
   a logic circuit being coupled to the slope detection circuit and being coupled to the output stage of the TIA, the logic circuit being configured to squelch the output stage of the TIA in response to the first slope-status signal.

10. The optical receiver of claim 9, further comprising:
    a received-signal-strength indicator (RSSI) configured to provide first and second indication signals, the first indication signal asserting loss of signal (LOS) at the photodiode, the second indication signal de-asserting the LOS at the photodiode.

11. The optical receiver of claim 10, wherein the logic circuit is configured to output, in response to the first indication signal asserting loss of signal (LOS), a squelch signal from the logic circuit to the output stage of the TIA.

12. The optical receiver of claim 11, wherein the logic circuit is configured to output, in response to the second indication signal de-asserting loss of signal (LOS) and the first slope-status signal indicating the slope is detected, a squelch signal from the first output terminal of the logic circuit to the output stage of the TIA.

13. The optical receiver of claim 11, wherein the slope detection circuit is further configured to provide, in response to a slope in the feedback signal being not detected, a second slope-status signal indicating the slope is not detected to the logic circuit.

14. The optical receiver of claim 13, wherein the logic circuit is configured to output, in response to the second indication signal de-asserting loss of signal (LOS) and the second slope-status signal indicating the slope is not detected, a squelch de-assert signal from the logic circuit to the output stage of the TIA, wherein the output stage of the TIA is activated in response to receiving the squelch de-assert signal.

15. The optical receiver of claim 9, further comprising a speed-up circuit coupled to the feedback amplifier of the TIA, wherein the speed-up circuit is configured to increase, in response to a slope in the feedback signal being detected, a recovery rate of the feedback amplifier.

16. The optical receiver of claim 9, wherein the slope detection circuit includes:
   a resistor-capacitor (RC) sub-circuit;
   a gain stage coupled to the RC sub-circuit;
   a subtractor coupled to the gain stage;
   a first comparator and a second comparator coupled to the subtractor; and
   an OR gate coupled to the first comparator and the second comparator.

17. The optical receiver of claim 16, wherein:
   the RC sub-circuit is configured to convert the feedback signal from the feedback amplifier into a first differential voltage; and
   the gain stage is configured to receive the first differential voltage and is configured to amplify the first differential voltage into a second differential voltage by multiplying the first differential voltage with an amplification factor.

18. The optical receiver of claim 17, wherein the subtractor is configured to provide a first output voltage according to the second differential voltage to the first comparator and the second comparator.

19. The optical receiver of claim 17, wherein:
   the first comparator is configured to output, in response to the second differential voltage being greater than a threshold voltage, a high voltage level to a first input terminal of the OR gate; and
   the second comparator is configured to output, in response to the second differential voltage being less than a negative value corresponding to the threshold voltage, the high voltage level to a second input terminal of the OR gate.

20. A method of controlling an output of a transimpedance amplifier (TIA), the method comprising:
   sending, in response to a first indication signal asserting loss of signal (LOS), a squelch signal to an output buffer of the TIA to squelch an output voltage of the TIA; and
   sending, in response to a second indication signal de-asserting LOS and a first slope-status signal indicating a slope is detected, a squelch signal to the output buffer of the TIA to squelch the output voltage of the TIA;
   sending, in response to the second indication signal de-asserting LOS and a second slope-status signal indicating the slope is not detected, an unsquelch signal to the output buffer of the TIA to unsquelch the output voltage of the TIA.

\* \* \* \* \*